(12) United States Patent
Lim et al.

(10) Patent No.: US 12,033,953 B2
(45) Date of Patent: Jul. 9, 2024

(54) ELECTRONIC DEVICE AND CROSSTALK MITIGATING SUBSTRATE

(71) Applicant: Intel Corporation, Santa Clara, CA (US)

(72) Inventors: Min Suet Lim, Simpang Ampat (MY); Tin Poay Chuah, Bayan Lepas (MY); Bok Eng Cheah, Bukit Gambir (MY); Jackson Chung Peng Kong, Tanjung Tokong (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/830,853

(22) Filed: Mar. 26, 2020

(65) Prior Publication Data
US 2020/0388578 A1 Dec. 10, 2020

(30) Foreign Application Priority Data
Jun. 10, 2019 (MY) .............................. PI2019003255

(51) Int. Cl.
*H01L 23/498* (2006.01)
*H01L 21/48* (2006.01)
(Continued)

(52) U.S. Cl.
CPC ........ *H01L 23/552* (2013.01); *H01L 21/4853* (2013.01); *H01L 21/4857* (2013.01);
(Continued)

(58) Field of Classification Search
CPC ......... H01L 23/49838; H01L 23/49822; H01L 23/552
See application file for complete search history.

(56) References Cited

U.S. PATENT DOCUMENTS

2013/0147034 A1* 6/2013 Chen .................. H01L 23/3192
257/737
2013/0320568 A1* 12/2013 Aoki ..................... H01L 25/105
257/777
(Continued)

FOREIGN PATENT DOCUMENTS

CN         104576547 A  *  4/2015  ....... H01L 23/49503
WO  WO-2017111855 A1  *  6/2017  ............. H01L 23/66

OTHER PUBLICATIONS

Definition of "through", http://www.dictionary.com (2021) (Year: 2021).*
(Continued)

*Primary Examiner* — Michele Fan
(74) *Attorney, Agent, or Firm* — Essential Patents Group, LLP

(57) ABSTRACT

A substrate may be included in an electronic device. The substrate may include a first layer that may include a dielectric material. The first layer may define a substrate surface. The substrate may include a second layer optionally including the dielectric material. The second layer may be coupled to the first layer. A wiring trace may be located in the substrate. A recess may extend through the substrate surface, the first layer, and may extend through the second layer. A substrate interconnect may be located within the recess. The substrate interconnect may be at least partially located below the substrate surface. The substrate interconnect may be in electrical communication with the wiring trace.

22 Claims, 9 Drawing Sheets

(51) Int. Cl.
*H01L 23/13* (2006.01)
*H01L 23/552* (2006.01)
*H01L 23/00* (2006.01)

(52) U.S. Cl.
CPC ........ *H01L 23/13* (2013.01); *H01L 23/49822* (2013.01); *H01L 23/49833* (2013.01); *H01L 23/49838* (2013.01); H01L 24/16 (2013.01); H01L 24/32 (2013.01); H01L 24/73 (2013.01); H01L 2224/16225 (2013.01); H01L 2224/32225 (2013.01); H01L 2224/73204 (2013.01); H01L 2924/3025 (2013.01)

(56) References Cited

U.S. PATENT DOCUMENTS

2016/0338202 A1* 11/2016 Park ................... H01L 24/00
2017/0148770 A1*  5/2017 Ishino ................ H01L 23/3121
2020/0251454 A1*  8/2020 Shih .................. H01L 21/561

OTHER PUBLICATIONS

"Malaysia Application Serial No. PI2019003255, Substantive Examination Adverse Report mailed Jan. 12, 2023", 5 pgs.

* cited by examiner

ELECTRONIC DEVICE AND CROSSTALK MITIGATING SUBSTRATE

CROSS-REFERENCE TO RELATED APPLICATION

This patent application claims the benefit of Malaysia Application Serial No. PI2019003255, filed Jun. 10, 2019, which is incorporated by reference herein its entirety.

BACKGROUND

An electronic device may include a semiconductor die. The semiconductor die may be coupled to a package. The package may be coupled to a substrate, for instance with a ball grid array. Crosstalk may degrade performance of the electronic device. For example, a first electrical signal transmitted in a first channel of the electronic device may affect a second electrical signal in a second channel. The crosstalk between the first channel and the second channel may degrade the performance of the electronic device.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
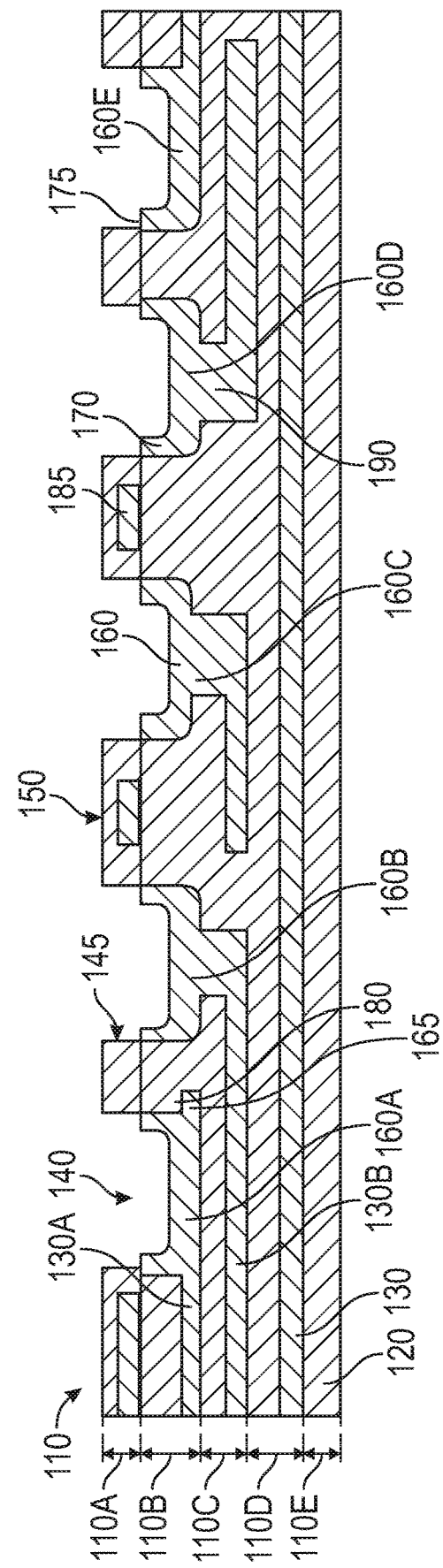
FIG. 1 is a schematic view of an example of a substrate.

The present inventors have recognized, among other things, that a problem to be solved may include reducing crosstalk between channels of an electronic device. The electronic device may include one or more channels (e.g., separated electrical communication pathways). Electrical signals may be transmitted within the channels of the electronic device. Crosstalk between the channels may affect the electrical signals transmitted within the channels. For example, an electromagnetic (e.g., capacitive, inductive, or the like) coupling between a first channel and a second channel may affect the electrical signals transmitted within the first channel and the second channel, for instance by introducing noise into the electrical signals. Noise may reduce the performance of the electronic device. The present inventors have recognized, among other things, that a problem to be solved may include tightening the pitch between channels of the electronic device, for instance to help facilitate form-factor miniaturization. The present inventors have recognized, among other things, that a problem to be solved may include reducing the dimensions (e.g., a length, width, and/or height) of the electronic device.

The present subject matter may help provide a solution to this problem, such as by providing a substrate that may be included in the electronic device. The substrate may include a first layer that may include a dielectric material. The first layer may define a substrate surface. The substrate may include a second layer optionally including the dielectric material. The second layer may be coupled to the first layer. A wiring trace may be located in the substrate. A recess may extend through the substrate surface, the first layer, and may extend through the second layer. A substrate interconnect may be located within the recess. The substrate interconnect may be at least partially located below the substrate surface. The substrate interconnect may be in electrical communication with the wiring trace.

The substrate may include a wiring trace shield. The wiring trace shield may help reduce crosstalk between the channels, for instance by enhancing a current return path of a respective transmission line and/or minimizing mutual capacitive coupling between the channels. The wiring trace shield may be included in the substrate, for instance in the first layer. For example, the wiring trace shield may be located between a first substrate interconnect associated with a first channel and a second substrate interconnect associated with a second channel. The wiring trace shield may be in electrical communication with a reference plane (e.g., ground reference plane, power voltage reference voltage, or the like). The channels may transmit an electrical signal different than the reference plane. Accordingly, electromagnetic energy that may cause crosstalk that is generated by the channels may be dissipated by locating the wiring trace shield between (or adjacent to) the first substrate interconnect and the second substrate interconnect.

A shield mesh may include a plurality of the wiring trace shields. For example, a first wiring trace shield may intersect a second wiring trace shield. A third wiring trace shield may be spaced apart from the first wiring trace shield, and the third wiring trace shield may be arranged to be parallel to the first wiring trace shield. Accordingly, the third wiring trace shield may intersect the second wiring trace shield. A fourth wiring trace shield may be spaced apart from the second wiring trace shield, and the fourth wiring trace shield may be arranged to be parallel to the second wiring trace shield. Accordingly, the fourth wiring trace shield may intersect the first wiring trace shield and the third wiring trace shield. The wiring trace shields may surround (e.g., enclose, encompass, wrap around, or the like) an individual one of the substrate interconnects and/or the vertical interconnects (e.g., the vertical interconnects 270, shown in FIG. 2). The wiring trace shields may be included in the first layer, for instance located adjacent to the substrate interconnects and/or the vertical interconnects. The vertical interconnects and the wiring trace shields may be located in the same layer (e.g., the first layer). The wiring trace shields may be in electrical communication with the reference plane. As a result, the individual one of the substrate interconnects (or the vertical interconnects) may be shielded from other ones of the substrate interconnects (or the vertical interconnects).

Locating the substrate interconnect within the recess may help reduce crosstalk between channels of the electronic device. Locating the substrate interconnect at least partially below the substrate surface may help reduce crosstalk between channels of the electronic device. For example, locating the substrate interconnect within the recess, or below the substrate surface, may help shield an individual channel from other ones of the channels. Crosstalk between channels (e.g., through the vertical interconnects 270, shown in FIG. 2) may be reduced because the dielectric material of the substrate may provide a shield between the channels, for instance by dissipating electromagnetic energy that may cause crosstalk between the channels (e.g., increasing the insulation, isolation, or the like between the channels). The wiling trace shield may provide a shield between the channels, for instance by enhancing the current return path of the respective transmission line and/or minimizing the mutual capacitive coupling between the channels. Accordingly, the substrate may help improve the performance of the electronic device.

The detailed description continues and is included to provide further information about the present patent application.

FIG. 1 is a schematic view of an example of a substrate 100. The substrate 100 may include a plurality of layers 110. For example, the substrate 100 may include a first layer 110A, a second layer 110B, a third layer 110C, a fourth layer 110D, and may include a fifth layer 110E. The layers 110 may include a dielectric material 120 (e.g., a polymeric material, epoxies with esters, a solder resist, or the like). The layers 110 may include one or more dielectric materials 120. For instance, the first layer 110A may include a first dielectric material, the second layer 110B may include a second dielectric material, and the third layer 110C may include a third dielectric material. The layers 110 may be coupled to each other, for instance the first layer 110A may be coupled to the second layer 110B. The layers 110 may be manufactured iteratively, for example with a semi-additive build up operation.

The substrate 100 may include one or more wiring traces 130, for instance a first wiring trace 130A and a second wiring trace 130B. The wiring traces 130 may include a conductive material (e.g., copper, aluminum, gold, or the like), and the wiring traces 130 may help transmit electrical signals within the substrate 100. The wiring traces 130 may be included in the layers 110 of the substrate 100. For example, the trace 130A may be included in the layer 110B, and the trace 130B may be included in the layer 110C.

The substrate 100 (or the layers 110 of the substrate 100) may define one or more recesses 140 (e.g., a cavity, hole, depression, or the like). The recesses 140 may have a sidewall 145, and the sidewall 145 of the recesses 140 may be defined by the substrate 100 (or the layers 110 of the substrate 100) extend through a surface 150 of the substrate 100. The recesses 140 may extend through the layers 110 of the substrate 100. For example, the recesses 140 (and the sidewall 145) may extend through the first layer 110A, and may extend through the second layer 110B. The recesses 140 may extend through additional or fewer layers 110 of the substrate (e.g., the layer 110D). The recesses 140 may be provided by an ablation operation (e.g., laser ablation, mechanical drilling, or the like) that removes a portion of the substrate 100.

The substrate 100 may include one or more substrate interconnects 160. For example, the substrate may include a first substrate interconnect 160A, a second substrate interconnect 160B, a third substrate interconnect 160C, a fourth substrate interconnect 160D, and may include a fifth substrate interconnect 160E. The substrate interconnects 160 may be located in the recesses 140. Individual ones of the substrate interconnects 160 may be located within corresponding individual ones of the plurality of recesses 140 (e.g., an individual substrate interconnect 160 is located within an individual recess 140). The substrate interconnects 160 may be located below the substrate surface 150. The substrate interconnects 160 may be located in the same layer 110 (e.g., layer 110B), or the substrate interconnects 160 may be located in different layers 110 (e.g., the substrate interconnect 160A may be located in the layer 110B, and the substrate interconnect 160B may be located in the layer 110C). Accordingly, the substrate interconnects 160 (and the recesses 140) may have varying depths with respect to the surface 150 of the substrate 100.

The substrate interconnects 160 may include a prong 170. The prong 170 may extend from (e.g., project from, stick out from, or the like) the substrate interconnect 160. The prong 170 may be adjacent to the sidewall 145 of the recess 140, for instance the prong 170 may be coupled to the sidewall 145. An intervening structure may be located between the prong 170 and the sidewall 145. The prong 170 may be coupled to the substrate interconnects 160 (e.g., the substrate interconnect 160D), and the prong 170 may be in electrical communication with the substrate interconnects 160. Mechanical reliability of an electrical contact (e.g., solder joint reliability between a ball grid array and the substrate interconnects 160) may be further improved through the prong 170, for instance by providing increased surface contact between the substrate interconnect 160 and vertical interconnects.

The prong 170 may be recessed from an edge 165 of the substrate interconnects 160 (e.g., the substrate interconnect 160A). For example, a notch 180 of the dielectric material 120 may be located between the prong 170 and the edge 165. Accordingly, the prong 170 may be coplanar with the edge 165, or recessed from the edge 165. The prong 170 may be located in the second layer 110B, and the substrate interconnects 160 may be located in the second layer 110B. However, the prong 170 (and the substrate interconnects 160) may be located in different layers 110 of the substrate 100 (e.g., the third layer 110C, the fourth layer 110D, or the like). The prong 170 may be at least partially exposed within the recess 140, for example, the prong 170 may be observable when observing the surface 150 of the substrate 100.

The prong 170 may extend around a perimeter of the sidewall 145 of the recesses 140. For example, the prong 170 may extend around an entirety of the perimeter of the sidewall 145 (e.g., the prong 170 is continuous around the sidewall 145). The prong 170 may extend around less than entirety of the perimeter of the sidewall 145 (e.g., the prong is discontinuous around the sidewall 145).

The substrate 100 may include a via 190. The via 190 may help electrically interconnect layers 110 of the substrate 100. As described herein, the wiring trace 130B may be located in the third layer 110C of the substrate 100 (or in other ones of the layers 110). The substrate interconnects 160 may be located in the second layer 110B (or in other ones of the layers 110). The via 190 may be coupled to the substrate interconnects 160 (e.g., the substrate interconnect 160D) and the wiring trace 130B. The via 190 may establish an electrical communication pathway between the substrate interconnects 160 and the wiring traces 130, for example when the substrate interconnects 160 and the wiring traces 130 are located in different layers 110 of the substrate 100.

The via 190 may have a via footprint (e.g., a first set of dimensions). The substrate interconnects 160 may have an interconnect footprint (e.g., a second set of dimensions). The via footprint may be different than the interconnect footprint, for example the via footprint may be smaller than the interconnect footprint. For instance, a width of the via 190 may be less than a width of the substrate interconnects 160 (e.g., the substrate interconnect 160D).

As described in greater detail herein, the substrate 100 may include a wiring trace shield 185. The wiring trace shield 185 may help reduce crosstalk between the channels (e.g., the channels 280, shown in FIG. 2), for instance by dissipating electromagnetic energy transmitted between the channels.

Figure 2:
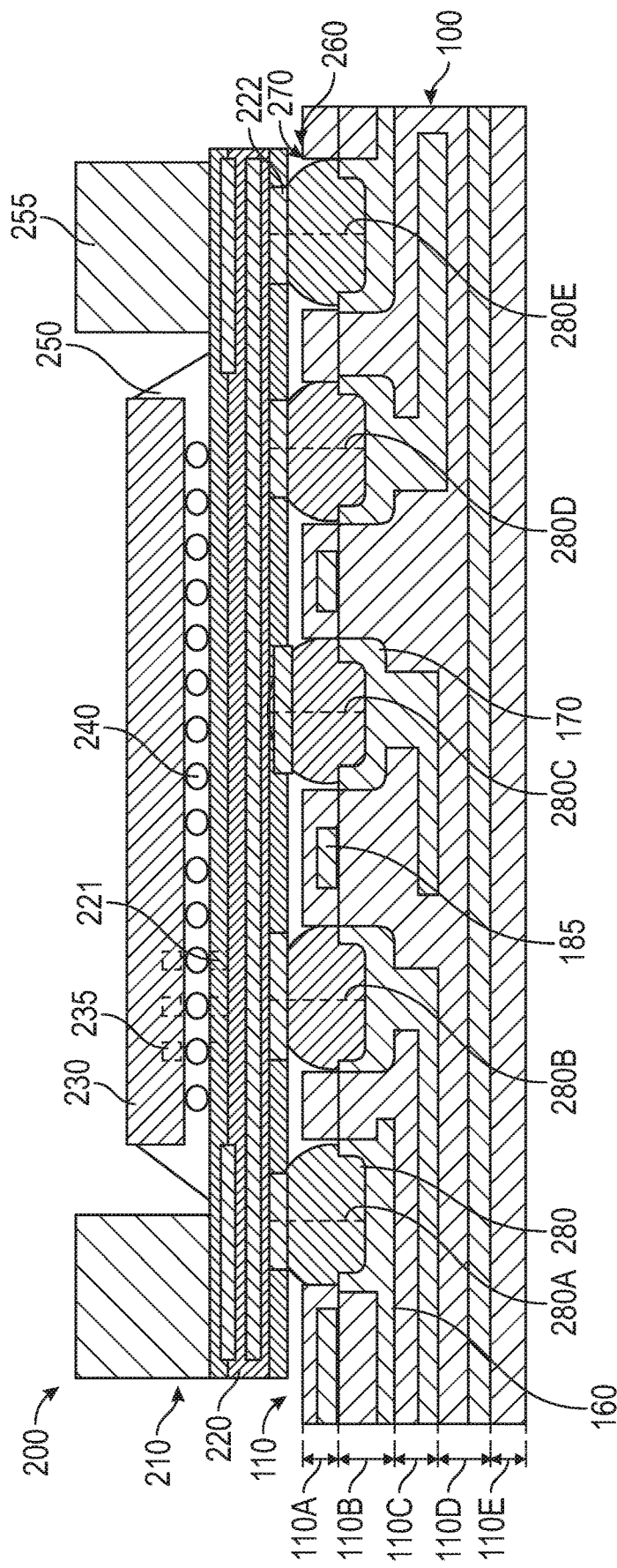
FIG. 2 is a schematic view of an example of an electronic device.

FIG. 2 is a schematic view of an example of an electronic device 200. The electronic device 200 may include a package 210. The package 210 may include a package substrate 220, and a semiconductor die 230 may be coupled to the package substrate 220. For example, package substrate 220 may include a first set of package interconnects 221 (e.g., pads, bumps, pillars, or the like), and the die 230 may include die interconnects 235 (e.g., pads, bumps, pillars, or the like). The package interconnects 221 may be coupled to the die interconnects, for instance with die bonds 240 (e.g., solder balls, micro-bumps, wire bonds, or the like). Accordingly, the die 230 may be in electrical communication with the package substrate 220. The package substrate 220 may help facilitate the electrical communication of the die 230 with other components of the electronic device 200, for instance by providing a pitch transformation between the die 230 and the substrate 100.

An underfill material 250 may improve the mechanical strength of the coupling between the package substrate 220 and the semiconductor die 230. For example, the underfill material 250 may include an epoxy that is applied to the die 230 and the package substrate 220. A stiffener 255 may be coupled to the package 210. For example, the stiffener 255 may be coupled to the package substrate 220, for instance to increase the rigidity of the package 220. Increasing the rigidity of the package substrate 220 may help prevent damage to the package 210 (e.g., decoupling of the interconnects 221, 235).

The electronic device 200 may include the substrate 100. The die 230 may be in electrical communication with the substrate 100. For example, the package substrate 220 may route electrical signals between the substrate 100 and the semiconductor die 230. The package substrate 220 may include a second set of package interconnects 222. The package interconnects 222 may be sized and shaped to couple with the substrate interconnects 160. For example, the package interconnects 222 may correspond to the substrate interconnects 160. (e.g., the package interconnects 222 and the substrate interconnects 160 may have a similar pitch, arrangement, configuration, or the like). A gap 260 (e.g., space, distance, cavity, or the like) may be located between the substrate 100 and the package substrate 220.

The electronic device 200 may include one or more vertical interconnects 270 (e.g., solder balls, contact pillars, wire bonds, or the like). The vertical interconnects 270 may include a composite solder material (e.g., tin, lead, aluminum, or the like, or a combination thereof). The vertical interconnects 270 may be located within (e.g., received in, contained within, or the like) the recesses 140 (shown in FIG. 1). For example, the recesses 140 may be sized and shaped to at least partially receive the vertical interconnects 270. The vertical interconnects 270 may be contained within the footprint of the recesses 140. For example, the vertical interconnects 270 may not interface with, or may not be coupled to, the surface 150 of the substrate 100 (shown in FIG. 1). The vertical interconnects 270 may at least partially extend through the first layer 110 and the second layer 110B of the substrate 100. Accordingly, a footprint of the recesses 140 may be greater than a footprint of the vertical interconnects 270 (e.g., a width of the recesses 140 may be greater than a footprint of the vertical interconnects 270). For instance, the greatest dimension (e.g., width) of the vertical interconnects 270 may be located between the sidewalk 145 of the recesses 140. The greatest dimension of the vertical interconnects 270 may be located between the surface 150 of the substrate 100 (shown in FIG. 1). The vertical interconnects 270 may be set within the recesses 140.

The vertical interconnects 270 may be coupled to a portion of the substrate 100. For example, the vertical interconnects 270 may be coupled to the sidewall 145 of the recesses 140 (shown in FIG. 1). The vertical interconnects 270 may be coupled to (and in electrical communication with) the substrate interconnects 160. The vertical interconnects 270 may be coupled to (and in electrical communication with) the prong 170 (shown in FIG. 1). The vertical interconnects 270 may be coupled to (and in electrical communication with) the package interconnects 222. The vertical interconnects 270 may mimic the shape of the prong 170 and/or the substrate interconnects 160 (e.g., a profile of the vertical interconnects 270 may mimic a profile of the prong 170).

The vertical interconnects 270 may facilitate coupling the package 210 with the substrate 100. For example, the electronic device 200 may include one or more channels 280 (e.g., electrical communication pathways that are substantially isolated from each other). The vertical interconnects 270 may help establish the one or more channels 280, for instance by establishing an electrical communication pathway between the substrate interconnects 160 and the package interconnects 222. For instance, the electronic device 200 may include a first channel 280A, a second channel 280B, a third channel 280C, a fourth channel 280D, and a fifth channel 280E. Individual ones of the channels 280 may be substantially isolated from other individual ones of the channels 280 (e.g., the channel 280A transmits a first electrical signal and the channel 280B transmits a second electrical signal). The channels 280A, 280E may be connected to a reference plane (e.g., a ground reference plane, a power reference plane, or the like), and the channels 280C, 280D, 280E may transmit an electrical signal.

The substrate 100 may include a wiring trace shield 185. The wiring trace shield 185 may help reduce crosstalk between the channels 280, for instance by improving the current return path of the channels 280 and/or minimizing the mutual capacitive coupling between the channels 280. The wiring trace shield 185 may be included in the first layer 110A. The wiring trace shield 185 may be located between the substrate interconnects 160. For example, the wiring trace shield 185 may be located between the second substrate interconnect 160B that may be associated with the second channel 280B, and the third substrate interconnect 160C that may be associated with the third channel 280C. The wiring trace shield 185 may be in electrical communication with a reference plane (e.g., a ground (Vss) reference plane or a power (Vcc) reference plane). The channels 280 may transmit an electrical signal different than the voltage reference plane. Accordingly, electromagnetic energy generated by the channels 280 that may cause crosstalk interference may be shielded by the wiring trace shield 185 located between the substrate interconnects 160. The electromagnetic energy that may cause crosstalk between the channels 280 may be mitigated through an improved current return path and/or minimized mutual capacitive coupling between the channels 280.

As described herein, crosstalk between the channels 280 may reduce the performance of the electronic device 200, for instance by distorting or altering an electrical signal transmitted in an individual channel. Containing the vertical interconnects 270 within the footprint of the recesses 140 allows the channels 280 to be in close proximity to the voltage reference plane (e.g., wiring shield trace 185), hence shorter current return path and minimized mutual capacitive coupling between the channels 280.

Locating the substrate interconnects 160 below the surface 150 (shown in FIG. 1), or below the first layer 110A, of the substrate 100 may help reduce crosstalk, for instance by reducing the amount of the vertical interconnects 270 located within the gap 260 between the package substrate 220 and the substrate 100. Reducing the amount of vertical interconnects 270 located in the gap 260 may help shield individual ones of the channels 280 (e.g., the channel 280A) from other (e.g., adjacent) individual ones of the channels (e.g., the channel 280B), for example by increasing the insulation between the channels 280 or reducing the electromagnetic coupling between adjacent ones of the vertical interconnects 270. Reducing the amount of vertical interconnects 270 located in the gap 260 may help reduce the dimensions of the gap 260, and accordingly may help reduce the size (e.g., thickness, z-height, or the like) of the electronic device 200. Reducing the dimension of the gap 260 may allow for increasing the size of other components of the electronic device 200, for example a battery).

Reducing crosstalk between the channels 280 may help facilitate reducing the amount of vertical interconnects 270 that may need to be in electrical communication with the reference plane. Reducing crosstalk between the channels 280 may help reduce the amount of channels 280 (e.g., channel 280A) that may be needed to shield other channels 280 that transmit an electrical signal. Accordingly, the performance of the electronic device 200 may be improved because the channels 280 that may be used for shielding, may instead be used for transmitting electrical signals. Because the substrate 100 reduces crosstalk between channels, the dimensions of the electronic device 200 may be reduced, for instance by reducing the amount of channels 280 that may be used for shielding, while maintaining the same (or better) level of performance in the electronic device 200. Reducing the dimensions of the electronic device 200 (e.g., footprint or real-estate) may allow for increasing the size of other components of an electronic system, for example a battery size.

Figure 3:
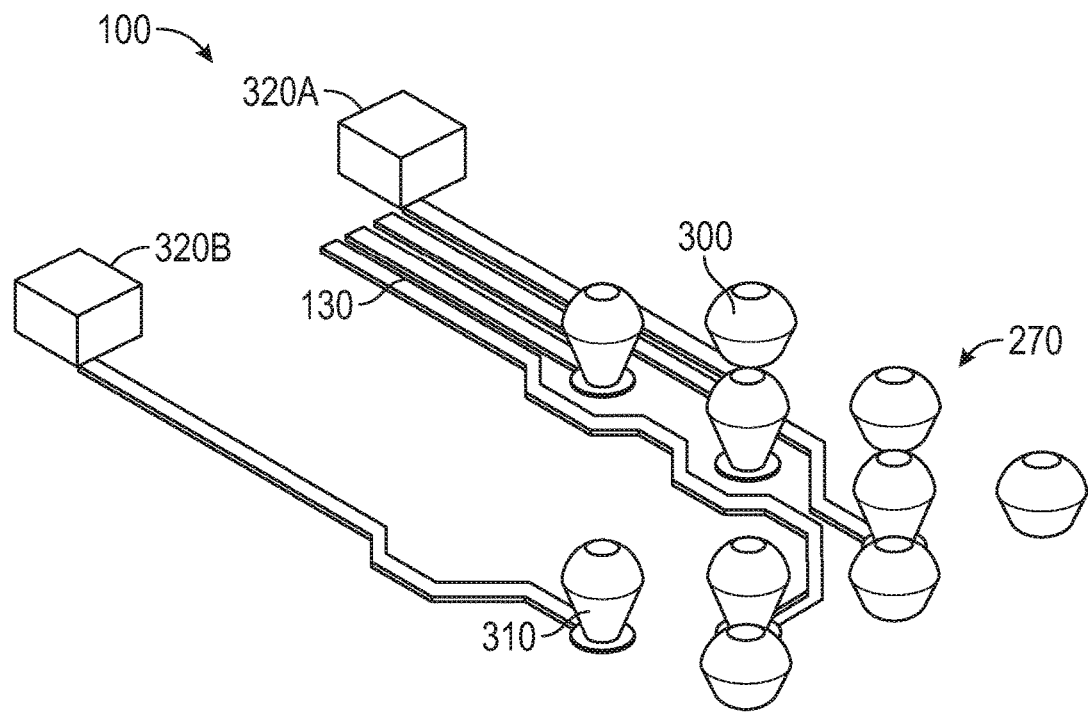
FIG. 3 is a schematic view of another example of the substrate of FIG. 1.

FIG. 3 is a schematic view of another example of the substrate 100 of FIG. 1. The vertical interconnects 270 may have a variety of profiles (e.g., shapes, cross-sections, perimeters, or the like). For example, a first portion 300 of the vertical interconnects 270 may have a hemispherical profile (e.g., one half of a sphere). A second portion 310 of the vertical interconnects 270 may have a frustoconical profile (e.g., a blunted cone). The vertical interconnects 270 may mimic the shape of the recesses 140 (shown in FIG. 1) or structures contained within the recesses 140 (e.g., the sidewall 145, the substrate interconnect 160, the prong 170, or the like, shown in FIG. 1).

As described herein, the vertical interconnects may be in electrical communication with the wiring traces 130. In some examples, one or more of the vertical interconnects 270 may be in electrical communication with a reference plane, for example a first reference plane 320A. The first reference plane 320A may be associated with a first reference voltage (e.g., ground, power, or the like). The one or more vertical interconnects 270 may be associated with a second reference plane 320B, and the second reference plane may be associated with a second reference voltage. The reference planes 320A, 320B may be associated with a common reference voltage. The wiring traces 130 may transmit electrical signals between the vertical interconnects 270 and the reference planes 320A, 320B.

Figure 4:
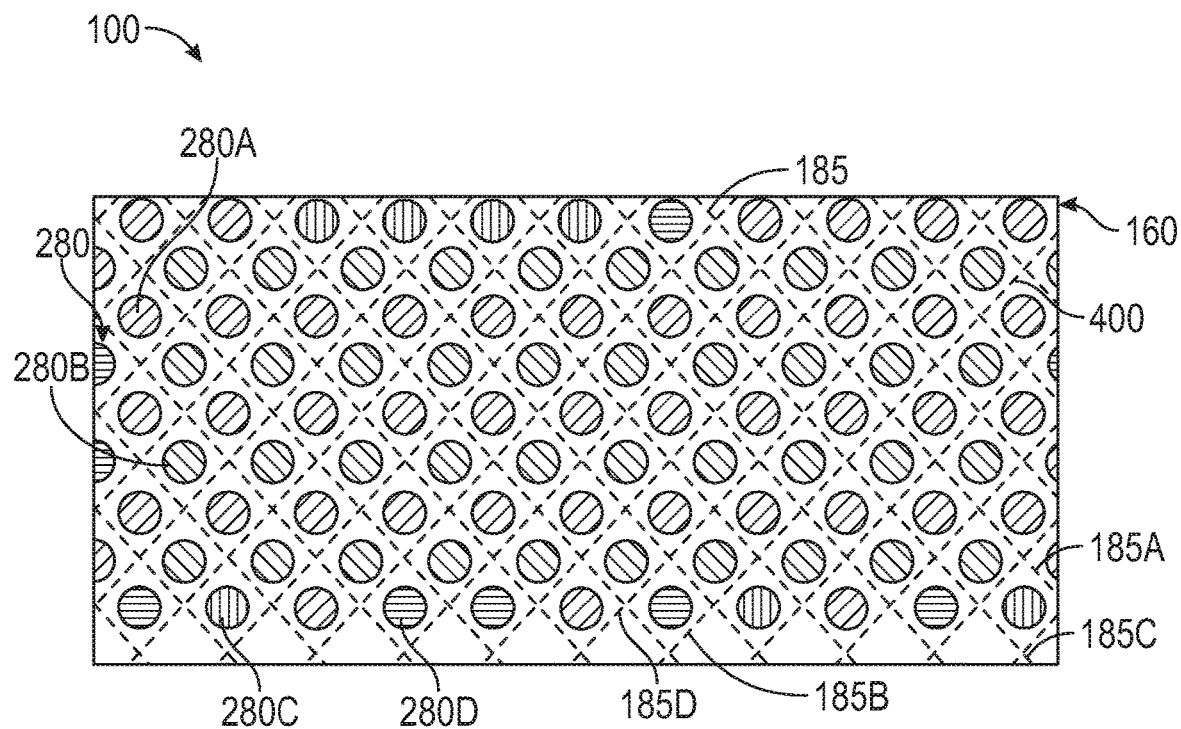
FIG. 4 is a schematic view of yet another example of the substrate of FIG. 1.

FIG. 4 is a schematic view of yet another example of the substrate 100 of FIG. 1. The substrate 100 may include a shield mesh 400, and the shield mesh 400 may include a plurality of the wiring trace shields 185. For example, a first wiring trace shield 185A may intersect a second wiring trace shield 185B. A third wiring trace shield 185C may be spaced apart from the first wiring trace shield 185A. The third wiring trace shield 185C may be arranged to be parallel to the first wiring trace shield 185C, however the present subject matter is not so limited. Accordingly, the third wiring trace shield 185C may intersect the second wiring trace shield 185B. A fourth wiring trace shield 185D may be spaced apart from the second wiring trace shield 185B. The fourth wiring trace shield 185D may be arranged to be parallel to the second wiring trace shield 185B, however the present subject matter is not so limited. Accordingly, the fourth wiring trace shield 185D may intersect the first wiring trace shield 185A and the third wiring trace shield 185C.

The wiring trace shields 185 may surround (e.g., enclose, encompass, wrap around, or the like) an individual one of the substrate interconnects 160. The wiring trace shields 185 may be in electrical communication with a reference voltage source, for example the reference plane 320A. As a result, the individual one of the substrate interconnects 160 may be shielded from other ones of the substrate interconnects 160.

The shield mesh 400 may help shield individual ones of the channels 280 from other individual ones of the channels 280. For example, the shield mesh 400 may help shield the first channel 280A from the second channel 280B, the third channel 280C, and the fourth channel 280D. The shield mesh 400 may help dissipate electromagnetic energy that may cause crosstalk between the channels 280.

Referring again to FIG. 2, reducing the amount of vertical interconnects 270 located in the gap 260, increasing the amount of vertical interconnects 270 located below the surface 150, increasing the amount of vertical interconnects 270 located below the first layer 110A, locating the wiring trace shield 185 between the channels, and/or locating the substrate interconnects 160 below the surface 150 of the substrate 100 may help reduce crosstalk between the channels 280.

Figure 5:
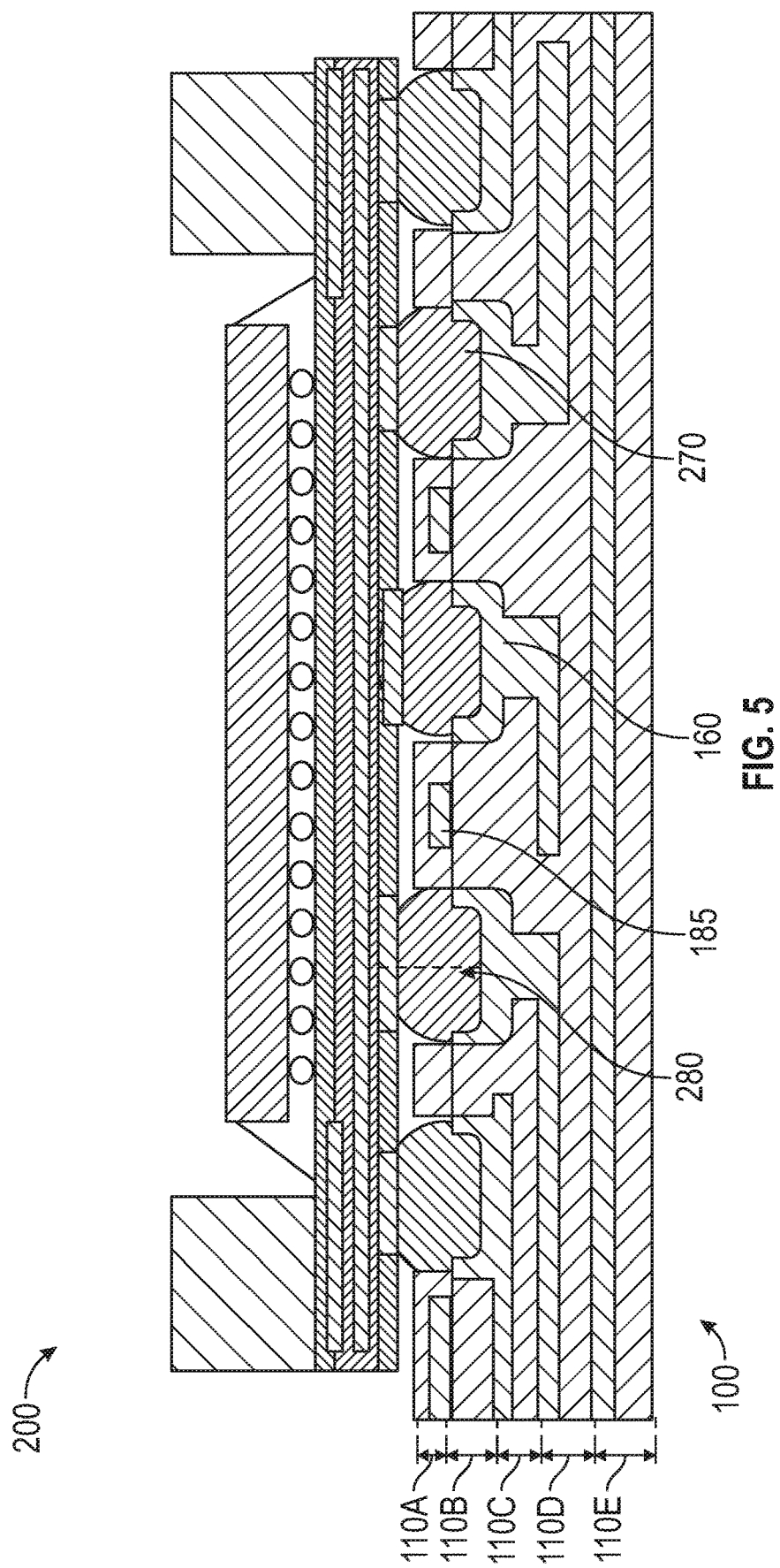
FIG. 5 is a schematic view of another example of the electronic device of FIG. 2.

FIG. 5 is a schematic view of another example of the electronic device 200 of FIG. 2. The wiring trace shield 185 may be included in one or more of the layers 110 of the substrate 100. For example, the wiring trace shield 185 may be located in the first layer 110A and the second layer 110B. The wiring trace shield 185 may span between (e.g., be simultaneously located in) the layers 110, for instance by increasing the dimensions of the wiring trace shield 185. Increasing the dimensions of the wiring trace shield 185 may help facilitate shielding an individual one of the channels 280 from other individual ones of the channels 280. The wiring trace shield 185 may be coplanar with a portion of the substrate interconnects 160. The wiring trace shield 185 may be coplanar with a portion of the vertical interconnects 270. Arranging the wiring trace shield 185 to be coplanar with a portion of the substrate interconnects 160 or a portion of the vertical interconnects 270 may help reduce crosstalk between the channels 280.

Figure 6:
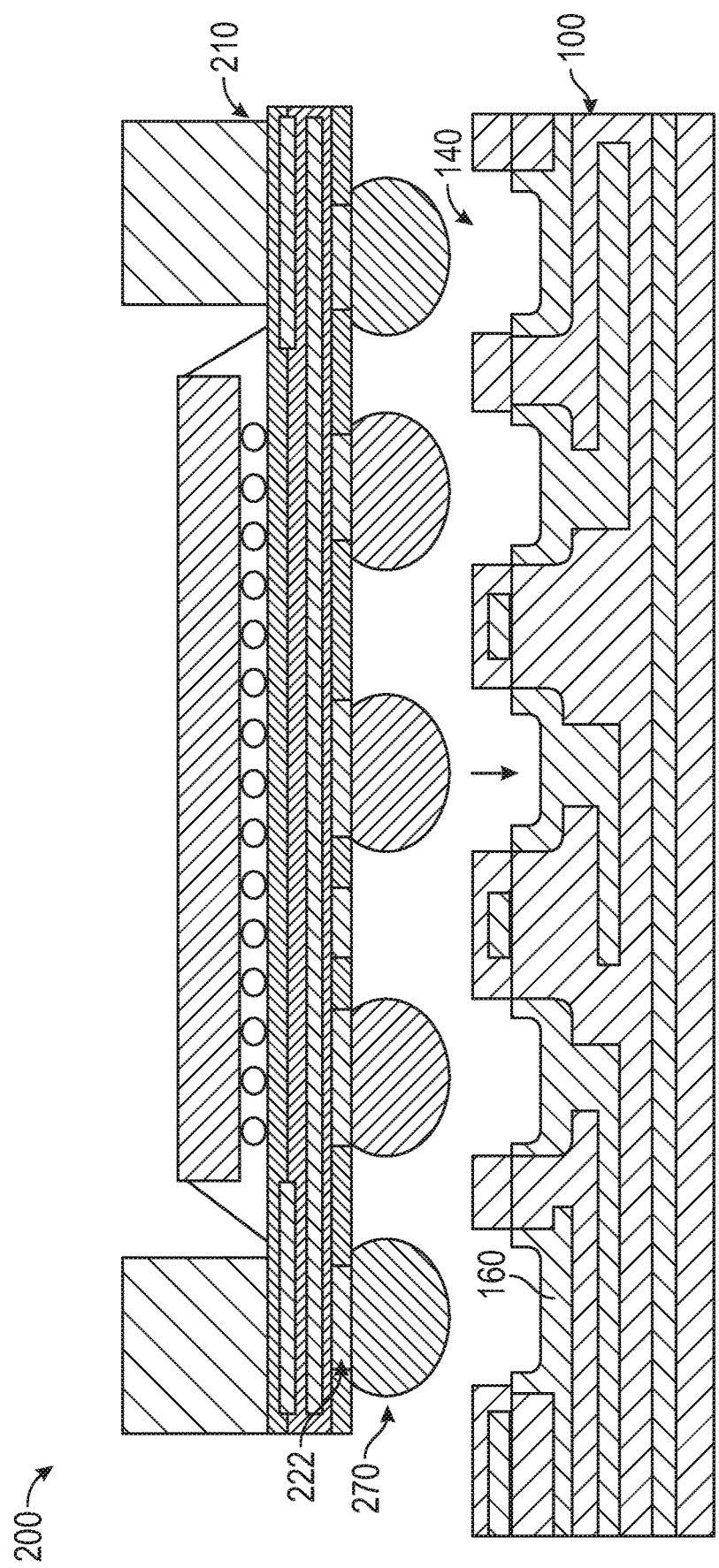
FIG. 6 is a schematic view of the electronic device of FIG. 2 during a manufacturing operation.
Figure 7:
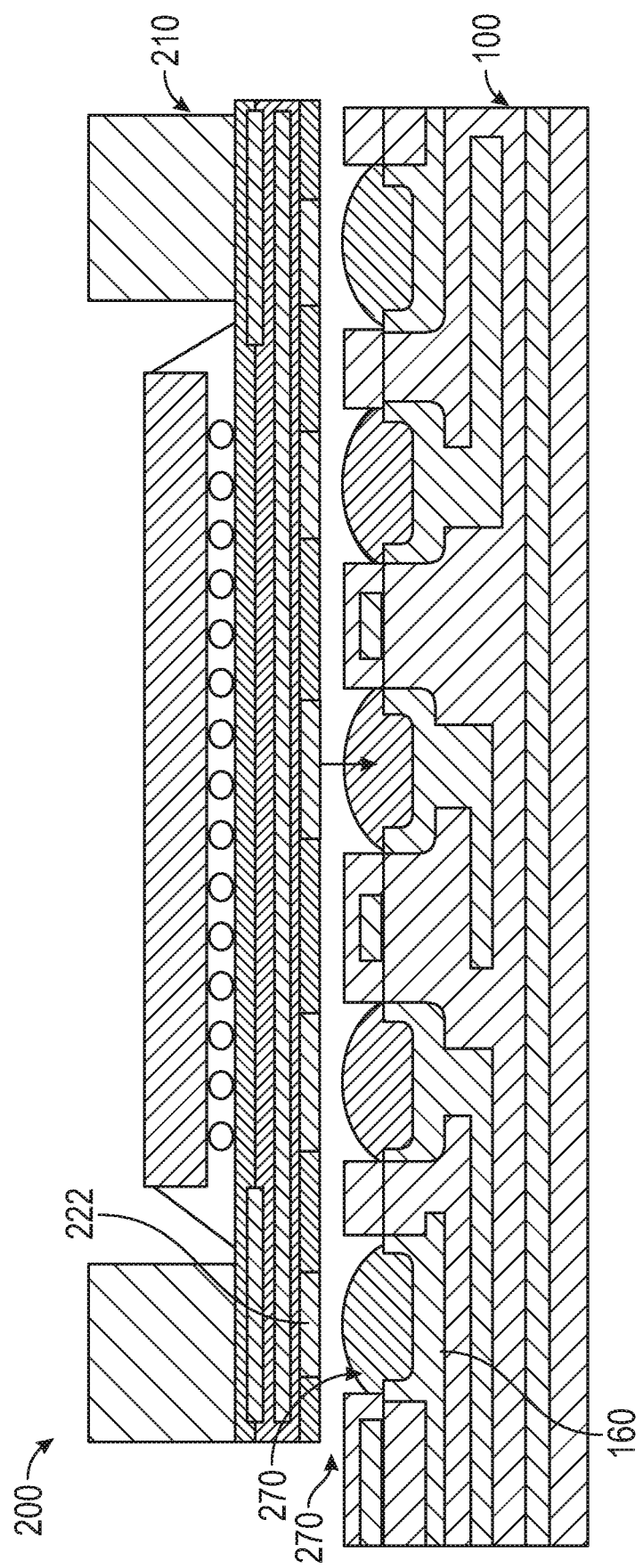
FIG. 7 is a schematic view of the electronic device of FIG. 2 during a manufacturing operation.

FIG. 6 and FIG. 7 are schematic views of the electronic device 200 of FIG. 2 during a manufacturing operation. The vertical interconnects 270 (e.g., solder material, or the like) may be coupled to the package interconnects 222 and the package 210 may be located proximate to the substrate 100, for instance to locate the vertical interconnects 270 within the recesses 140. Once located within (e.g., inserted into) the recesses 140, the vertical interconnects 270 may be coupled to the package interconnects 160, for instance by reflowing (e.g., heating) the vertical interconnects 270. Accordingly, the package 210 may be coupled to the substrate 100.

The vertical interconnects 270 may be coupled to the substrate interconnects 160 (prior to being coupled to the package interconnects 222), and the package 210 may be located proximate to the substrate 100. The vertical interconnects 270 may be reflowed with the package 210 located proximate to the substrate 100. Accordingly, the vertical interconnects 270 located within the recesses 140 may be coupled to the package interconnects 222, and the package 210 may be coupled to the substrate 100.

Figure 8:
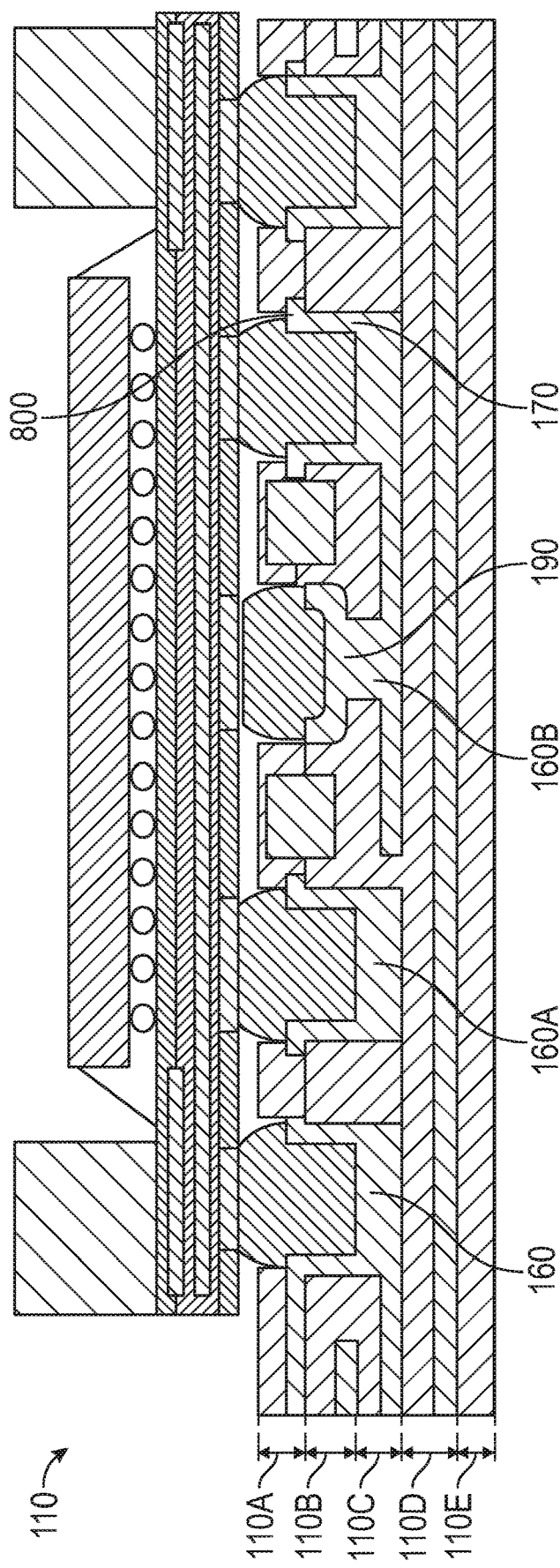
FIG. 8 is a schematic view of yet another example of the electronic device of FIG. 2.

FIG. 8 is a schematic view of yet another example of the electronic device 200 of FIG. 2. As described herein, substrate interconnects 160 may be located within the layers 110 of the substrate 100. For example, a first substrate interconnect 160A may be located in the third layer 110C. A second substrate interconnect 160B may be located in the second layer 110B. Accordingly, the substrate interconnects 160 may be located within different layers 110 of the substrate 100. As described herein, the via 190 may help facilitate coupling the substrate interconnects 160 (e.g., the second substrate interconnect 160B) with the wiring traces 130, for instance if the wiring traces 130 are located in a different layer (e.g., the third layer 110C) than the substrate interconnects 160.

The substrate 100 may include a wing 800, and the wing may extend from the prong 170. The wing 800 may be spaced apart from the substrate interconnect 160 by the prong 170. The wing 800 may improve the mechanical reliability of the interface (e.g., a solder joint, or the like) between the vertical interconnects 270 and the substrate interconnects 160.

Figure 9:
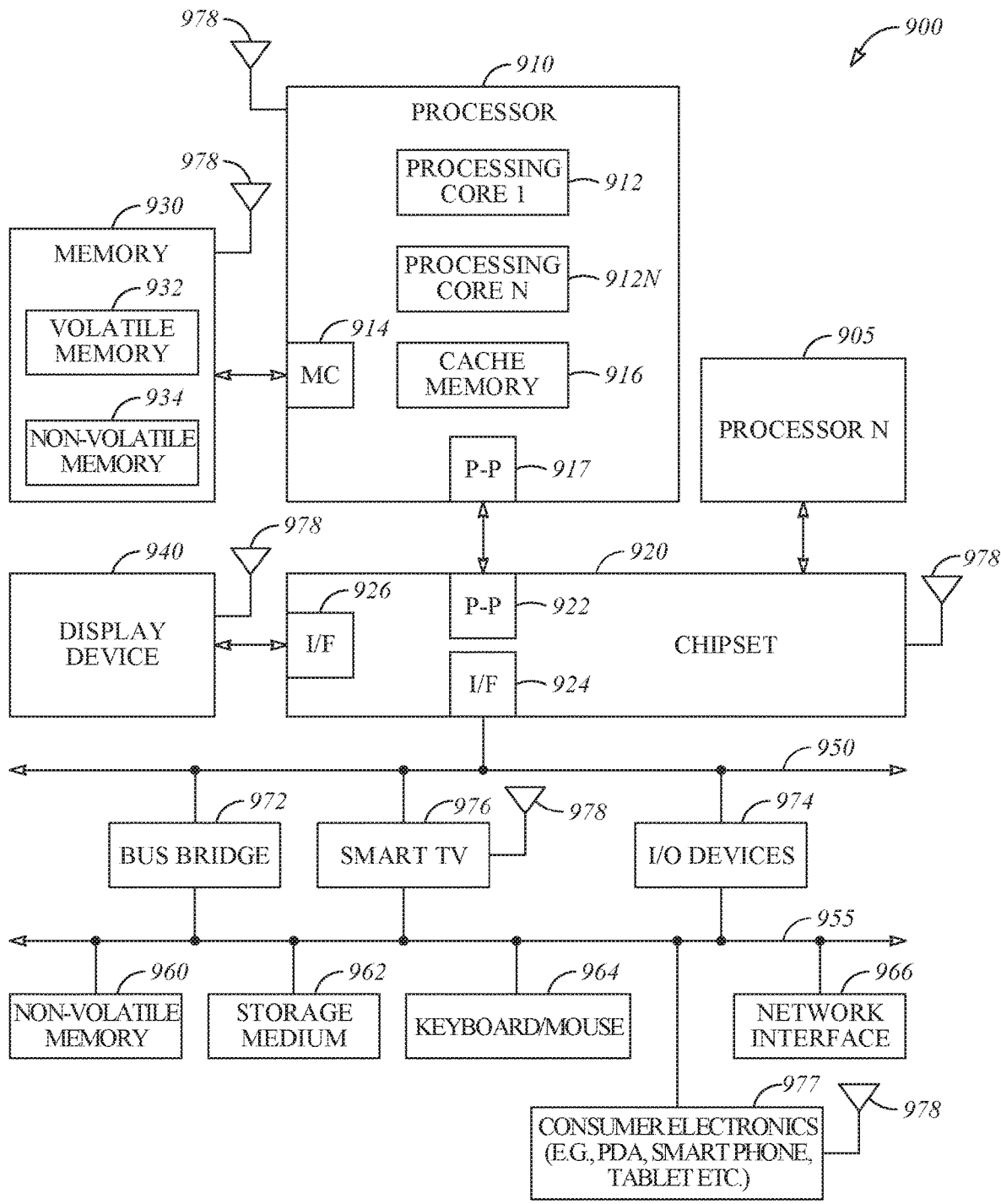
FIG. 9 illustrates a system level diagram, depicting an example of an electronic device including the substrate of FIG. 1 or the electronic device of FIG. 2.

FIG. 9 illustrates a system level diagram, depicting an example of an electronic device (e.g., system) including the substrate 100 or the electronic device 200 as described in the present disclosure. FIG. 9 is included to show an example of a higher-level device application for the substrate 100 or the electronic device 200. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processor cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, an interface for wireless antenna 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the example system, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices, including a bus bridge 972, a smart TV 976, I/O devices 974, nonvolatile memory 960, a storage medium (such as one or more mass storage devices) 962, a keyboard/mouse 964, a network interface 966, and various forms of consumer electronics 977 (such as a PDA, smart phone, tablet etc.), etc. In one embodiment, chipset 920 couples with these devices through an interface 924. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the example system, processor 910 and chipset 920 are merged into a single SOC. In addition, chipset 920 connects to one or more buses 950 and 955 that interconnect various system elements, such as I/O devices 974, nonvolatile memory 960, storage medium 962, a keyboard/mouse 964, and network interface 966. Buses 950 and 955 may be interconnected together via a bus bridge 972.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

Figure 10:
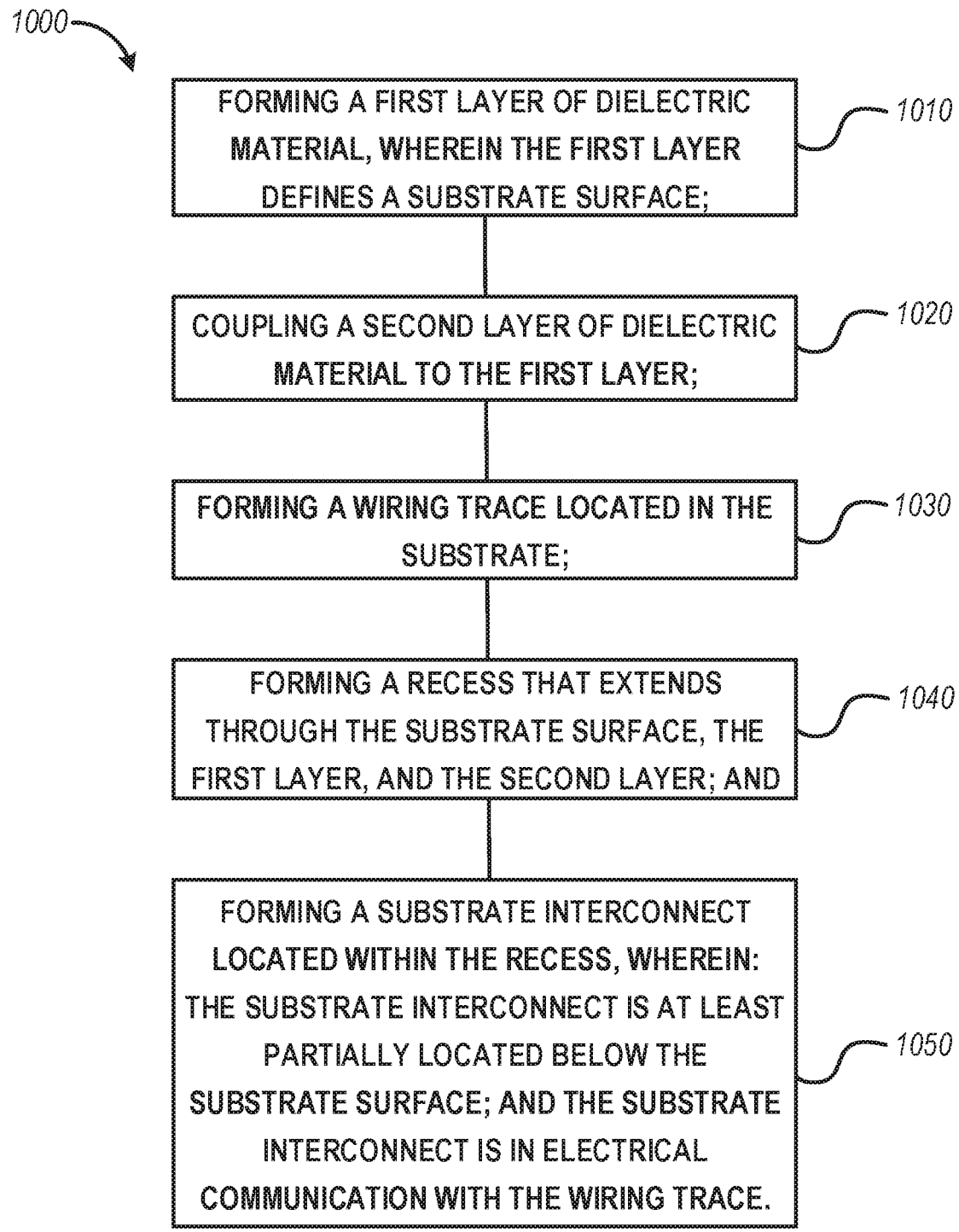
FIG. 10 shows one example of a method for manufacturing a substrate.

FIG. 10 shows one example of a method 1000 for manufacturing a substrate, including one or more of the substrate 100 described herein. In describing the method 1000, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 1000 include, but are not limited to, the corresponding numbered elements provided herein and other corresponding elements described herein (both numbered and unnumbered) as well as their equivalents.

At 1010, the method 1000 may include forming a first layer 110A of dielectric material 120. The first layer 110A may define a substrate surface 150. The method 1000 may include at 1020 coupling a second layer 110B of dielectric material 120 to the first layer 110A. At 1030, a wiring trace 130 may be formed (e.g., with a plating operation, or the like), and the wiring trace 130 may be located in the substrate 100. At 1040, a recess 140 may be formed, and the recess 140 may extend through the substrate surface 150, the first layer 110A, and the second layer 110A. At 1050, a substrate interconnect 160 may be formed. The substrate interconnect 160 may be located within the recess 140. The substrate interconnect 160 may be at least partially located below the substrate surface 150. The substrate interconnect 160 may be in electrical communication with the wiring trace 130.

Various Notes & Aspects

Aspect 1 may include or use subject matter (such as an apparatus, a system, a device, a method, a means for performing acts, or a device readable medium including instructions that, when performed by the device, may cause the device to perform acts), such as may include or use a substrate for an electronic device, comprising: a first layer of dielectric material and defining a substrate surface; a second layer of dielectric material coupled to the first layer; a wiring trace located in the substrate; a recess extending through the substrate surface, the first layer, and the second layer; and a substrate interconnect located within the recess, wherein: the substrate interconnect is at least partially located below the substrate surface; and the substrate interconnect is in electrical communication with the wiring trace.

Aspect 2 may include or use, or may optionally be combined with the subject matter of Aspect 1, to optionally include or use a prong extending from the substrate interconnect and adjacent to a sidewall of the recess.

Aspect 3 may include or use, or may optionally be combined with the subject matter of Aspect 2 to optionally include or use wherein the prong is recessed from an edge of the interconnect.

Aspect 4 may include or use, or may optionally be combined with the subject matter of one or any combination of Aspects 2 or 3 to optionally include or use wherein a wing extends from the prong, and the wing is spaced apart from the substrate interconnect by the prong.

Aspect 5 may include or use, or may optionally be combined with the subject matter of one or any combination of Aspects 1 through 4 to optionally include or use a wiring trace shield configured to be in electrical communication with a reference plane, wherein the wiring trace shield is configured to reduce crosstalk within the substrate.

Aspect 6 may include or use, or may optionally be combined with the subject matter of one or any combination of Aspects 1 through 5 to optionally include or use a solder material coupled to the substrate interconnect, wherein the solder material is located below the substrate surface and is contained within a footprint of the recess.

Aspect 7 may include or use, or may optionally be combined with the subject matter of one or any combination of Aspects 1 through 6 to optionally include or use a via coupled to the substrate interconnect and the wiring trace, wherein the via has a via footprint, the substrate interconnect has an interconnect footprint, and the via footprint is smaller than the interconnect footprint.

Aspect 8 may include or use, or may optionally be combined with the subject matter of one or any combination of Aspects 1 through 7 to optionally include or use wherein the wiring trace is at least partially located in the first layer or the second layer.

Aspect 9 may include or use, or may optionally be combined with the subject matter of one or any combination of Aspects 1 through 8 to optionally include or use wherein the substrate interconnect is at least partially located in the second layer.

Aspect 10 may include or use, or may optionally be combined with the subject matter of one or any combination of Aspects 1 through 9 to optionally include or use a third layer of dielectric material coupled to the second layer, and wherein the substrate interconnect is at least partially located in the third layer.

Aspect 11 may include or use, or may optionally be combined with the subject matter of Aspect 10 to optionally include or use a fourth layer of dielectric material coupled to the third layer; and a via coupled to the substrate interconnect and the wiring trace, wherein the via is at least partially located in the fourth layer.

Aspect 12 may include or use subject matter (such as an apparatus, a system, a device, a method, a means for performing acts, or a device readable medium including instructions that, when performed by the device, may cause the device to perform acts), such as may include or use a substrate for an electronic device, comprising: a first layer of dielectric material and defining a substrate surface; a second layer of dielectric material coupled to the first layer; a plurality of wiring traces located in the substrate, wherein the plurality of wiring traces includes a first wiring trace, a second wiring trace, and a third wiring trace; a plurality of recesses extending through the substrate surface, the first layer, and the second layer; and a plurality of substrate interconnects, wherein: individual ones of the plurality of substrate interconnects are located within corresponding individual ones of the plurality of recesses; the plurality of substrate interconnects includes a first substrate interconnect, a second substrate interconnect, and a third substrate interconnect; and the plurality of substrate interconnects are at least partially located below the substrate surface; the first substrate interconnect is in electrical communication with the first wiring trace; the second substrate interconnect is in electrical communication with the second wiring trace; and the third substrate interconnect is in electrical communication with the third wiring trace.

Aspect 13 may include or use, or may optionally be combined with the subject matter of Aspect 12, to optionally include or use wherein: the first substrate interconnect is in electrical communication with a reference plane; the second substrate interconnect is configured to transmit a first signal; the third substrate interconnect is configured to transmit a second signal; and a first wiring trace shield is in electrical communication with the reference plane, wherein the first wiring trace shield is located between the second substrate interconnect and the third substrate interconnect, wherein the wiring trace shield is configured to reduce crosstalk between the second substrate interconnect and the third substrate interconnect.

Aspect 14 may include or use, or may optionally be combined with the subject matter of Aspect 13 to optionally include or use a third layer of dielectric material coupled to the second layer, wherein: the first wiring trace is located in the second layer; the second wiring trace is located in the third layer.

Aspect 15 may include or use, or may optionally be combined with the subject matter of one or any combination of Aspects 13 or 14 to optionally include or use a second wiring trace shield in electrical communication with the reference plane, wherein the second wiring trace shield is located between the third substrate interconnect and a fourth substrate interconnect.

Aspect 16 may include or use, or may optionally be combined with the subject matter of one or any combination of Aspects 13 through 15 to optionally include or use wherein the first wiring trace shield is located in two or more layers of the substrate.

Aspect 17 may include or use, or may optionally be combined with the subject matter of one or any combination of Aspects 13 through 16 to optionally include or use wherein the wiring trace shield is at least partially located within the same layer of the substrate as the first substrate interconnect or the second substrate interconnect.

Aspect 18 may include or use, or may optionally be combined with the subject matter of one or any combination of Aspects 12 through 17 to optionally include or use a fourth substrate interconnect in electrical communication with a fourth wiring trace and the reference plane, wherein the second substrate interconnect and the third substrate interconnect are located between the first substrate interconnect and the fourth substrate interconnect.

Aspect 19 may include or use, or may optionally be combined with the subject matter of one or any combination of Aspects 12 through 18 to optionally include or use wherein the first substrate interconnect is located in a different layer of the substrate than the second substrate interconnect.

Aspect 20 may include or use subject matter (such as an apparatus, a system, a device, a method, a means for performing acts, or a device readable medium including instructions that, when performed by the device, may cause the device to perform acts), such as may include or use an electronic device, comprising: a semiconductor die including die interconnects; a package, including: a first set of package interconnects located on a first side of the package; a second set of package interconnects located on a second side of the package; wherein the semiconductor die is coupled to the package by coupling the die interconnects with the first set of package interconnects; a substrate, including: a first layer of dielectric material and defining a substrate surface; a second layer of dielectric material coupled to the first layer; a plurality of wiring traces located in the substrate; a plurality of recesses extending through the substrate surface; and a plurality of substrate interconnects, wherein: individual ones of the plurality of substrate interconnects are located within corresponding individual ones of the plurality of recesses; and the plurality of substrate interconnects are at least partially located below the substrate surface; and wherein the second set of package interconnects are coupled to the substrate interconnects with one or more vertical interconnects and individual ones of the vertical interconnects are located within a footprint of individual ones the respective recesses.

Aspect 21 may include or use, or may optionally be combined with the subject matter of Aspect 20, to optionally include or use wherein the vertical interconnects are located in a gap between the package and the substrate, and the vertical interconnects have a frustoconical shape or a hemispherical shape in the gap between the package and the substrate.

Aspect 22 may include or use, or may optionally be combined with the subject matter of one or any combination of Aspects 20 or 21 to optionally include or use a solder material coupled to the interconnect and an individual one of the second set of package interconnects, wherein the solder material is at least partially located below the substrate surface.

Aspect 23 may include or use, or may optionally be combined with the subject matter of one or any combination of Aspects 20 through 22 to optionally include or use a prong extending from an individual one of the plurality of substrate interconnects and, wherein the prong is adjacent to a sidewall of an individual one of the plurality of recesses.

Aspect 24 may include or use, or may optionally be combined with the subject matter of one or any combination of Aspects 20 through 23 to optionally include or use wherein: the plurality of substrate interconnects includes a first substrate interconnect, a second substrate interconnect, and a third substrate interconnect; the first substrate interconnect is in electrical communication with a reference plane; the second substrate interconnect is configured to transmit a first signal; the third substrate interconnect is configured to transmit a second signal; and a wiring trace shield is in electrical communication with the reference plane and is located between the second substrate interconnect and the third substrate interconnect, wherein the wiring trace shield is configured to reduce crosstalk between the second substrate interconnect and the third substrate interconnect.

Aspect 25 may include or use, or may optionally be combined with the subject matter of one or any combination of Aspects 20 through 24 to optionally include or use a shield mesh including a plurality of wiring trace shields, wherein: the plurality of wiring trace shields are in electrical communication with a reference plane; and the shield mesh is configured to reduce crosstalk between individual ones of the plurality of substrate interconnects or individual ones of the vertical interconnects.

Aspect 26 may include or use, or may optionally be combined with the subject matter of one or any combination of Aspects 20 through 25 to optionally include or use wherein a pitch of the first set of package interconnects is less than a pitch of the second set of package interconnects.

Aspect 27 may include or use, or may optionally be combined with any portion or combination of any portions of any one or more of Aspects 1 through 26 to include or use, subject matter that may include means for performing any one or more of the functions of Aspects 1 through 26, or a machine-readable medium including instructions that, when performed by a machine, cause the machine to perform any one or more of the functions of Aspects 1 through 26.

Each of these non-limiting aspects may stand on its own, or may be combined in various permutations or combinations with one or more of the other aspects.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A substrate for an electronic device, comprising:
   a first layer of dielectric material defining a substrate surface;
   a second layer of dielectric material coupled to the first layer;
   a first and second wiring trace located in the substrate;
   a first and second recess, each of the recesses extending through the substrate surface, the first layer, and the second layer;
   a first substrate interconnect located within the first recess and a second substrate interconnect located within the second recess, wherein:
      the first and second substrate interconnects each comprise a prong extending toward the substrate surface;
      the prong is adjacent to a sidewall of a corresponding one of the recesses;
      the prong is only located below the substrate surface with an exposed surface of the prong defining a bottom of an open portion of the corresponding one of the recesses; and
      the first substrate interconnect is in electrical communication with the first wiring trace, and the second substrate interconnect is in electrical communication with the second wiring trace; and
   a wiring trace shield within the first layer and between the first and second recesses, wherein a top of the wiring trace shield is more proximal to the substrate surface than is the exposed surface of the prong.

2. The substrate of claim 1, wherein the prong is included in the second layer of the substrate.

3. The substrate of claim 1, further comprising a wing extending from the prong, and the wing is located below the substrate surface.

4. The substrate of claim 1, wherein the prong extends to a prong end, and the prong end is located below the substrate surface.

5. The substrate of claim 1, further comprising a via coupled to the first substrate interconnect and the first wiring trace, wherein the via has a via footprint, the first substrate interconnect has an interconnect footprint, and the via footprint is smaller than the interconnect footprint.

6. The substrate of claim 1, wherein each of the first wiring trace and the second wiring trace is at least partially located in the first layer or the second layer.

7. The substrate of claim 1, wherein each of the first substrate interconnect and the second substrate interconnect is at least partially located in the second layer.

8. The substrate of claim 1, further comprising a third layer of dielectric material coupled to the second layer, and wherein each of the first substrate interconnect and the second substrate interconnect is at least partially located in the third layer.

9. The substrate of claim 8, further comprising:
a fourth layer of dielectric material coupled to the third layer; and
a via coupled to the first substrate interconnect and the first wiring trace, wherein the via is at least partially located in the fourth layer.

10. A substrate for an electronic device, comprising:
a first layer of dielectric material and defining a substrate surface; a second layer of dielectric material coupled to the first layer;
a plurality of wiring traces located in the substrate, wherein the plurality of wiring traces includes a first wiring trace, a second wiring trace, and a third wiring trace;
a plurality of recesses extending through the substrate surface, the first layer, and the second layer; and
a plurality of substrate interconnects, wherein:
individual ones of the plurality of substrate interconnects are located within corresponding individual ones of the plurality of recesses;
the plurality of substrate interconnects includes a first substrate interconnect, a second substrate interconnect, and a third substrate interconnect;
each of the substrate interconnects comprise a prong extending toward the substrate surface, and the prong is only located below the substrate surface;
the first substrate interconnect is in electrical communication with the first wiring trace;
the second substrate interconnect is in electrical communication with the second wiring trace; and
the third substrate interconnect is in electrical communication with the third wiring trace; and
wherein:
the first substrate interconnect is in electrical communication with a reference plane;
the second substrate interconnect is configured to transmit a first signal;
the third substrate interconnect is configured to transmit a second signal;
a first wiring trace shield is in electrical communication with the reference plane; and
the first wiring trace shield is located between the second substrate interconnect and the third substrate interconnect.

11. The substrate of claim 10,
wherein a top of the wiring trace shield is more proximal to the substrate surface than is a top of the prong.

12. The substrate of claim 11, further comprising a third layer of dielectric material coupled to the second layer, wherein:
the first wiring trace is located in the second layer; and
the second wiring trace is located in the third layer.

13. The substrate of claim 11, further comprising a second wiring trace shield in electrical communication with the reference plane, wherein the second wiring trace shield is located between the third substrate interconnect and a fourth substrate interconnect.

14. The substrate of claim 11, wherein the first wiring trace shield is located in two or more layers of the substrate.

15. The substrate of claim 11, wherein the wiring trace shield is at least partially located within the same layer of the substrate as the first substrate interconnect or the second substrate interconnect.

16. The substrate of claim 11, further comprising a fourth substrate interconnect in electrical communication with a fourth wiring trace and the reference plane, wherein the second substrate interconnect and the third substrate interconnect are located between the first substrate interconnect and the fourth substrate interconnect.

17. The substrate of claim 10, wherein the first substrate interconnect is located in a different layer of the substrate than the second substrate interconnect.

18. An electronic device, comprising:
a semiconductor die including die interconnects;
a package, including:
a first set of package interconnects located on a first side of the package;
a second set of package interconnects located on a second side of the package; wherein the semiconductor die is coupled to the package by coupling the die interconnects with the first set of package interconnects;
a substrate, including:
a first layer of dielectric material and defining a substrate surface;
a second layer of dielectric material coupled to the first layer;
a plurality of wiring traces located in the substrate;
a plurality of recesses extending through the substrate surface;
a plurality of substrate interconnects, wherein:
individual ones of the plurality of substrate interconnects are located within corresponding individual ones of the plurality of recesses;
each of the substrate interconnects comprise a prong extending toward the substrate surface, and the prong is only located below the substrate surface; and
wherein the second set of package interconnects are coupled to the substrate interconnects with one or more vertical interconnects and individual ones of the vertical interconnects are located within a footprint of individual ones the respective recesses; and
a wiring trace shield located between individual ones of the substrate interconnects, wherein a top of the wiring trace shield is more proximal to the substrate surface than is a top surface of the prong of corresponding ones of the substrate interconnects.

19. The electronic device of claim 18, wherein the vertical interconnects are located in a gap between the package and the substrate, and the vertical interconnects have a frustoconical shape or a hemispherical shape in the gap between the package and the substrate.

20. The substrate of claim 18, wherein the prong for each of the substrate interconnects extends to a prong end, and the prong end is located below the substrate surface.

21. The substrate of claim 18, wherein:
the plurality of substrate interconnects includes a first substrate interconnect, a second substrate interconnect, and a third substrate interconnect;
the first substrate interconnect is in electrical communication with a reference plane; the second substrate interconnect is configured to transmit a first signal;
the third substrate interconnect is configured to transmit a second signal; and
the wiring trace shield is in electrical communication with the reference plane and is located between the second substrate interconnect and the third substrate interconnect, wherein the wiring trace shield is configured to reduce crosstalk between the second substrate interconnect and the third substrate interconnect.

22. The substrate of claim 18, further comprising a shield mesh including a plurality of wiring trace shields, wherein:
the plurality of wiring trace shields are in electrical communication with a reference plane; and
the shield mesh is configured to reduce crosstalk between individual ones of the plurality of substrate interconnects or individual ones of the vertical interconnects.

* * * * *